(12) United States Patent
Yano et al.

(10) Patent No.: US 7,276,437 B2
(45) Date of Patent: Oct. 2, 2007

(54) SEMICONDUCTOR DEVICE AND MANUFACTURING METHOD THEREOF

(75) Inventors: Yuji Yano, Tenri (JP); Atsuya Narai, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/028,861

(22) Filed: Jan. 5, 2005

(65) Prior Publication Data

US 2005/0148175 A1    Jul. 7, 2005

Related U.S. Application Data

(62) Division of application No. 10/162,864, filed on Jun. 6, 2002, now abandoned, which is a division of application No. 09/495,300, filed on Feb. 1, 2000, now abandoned.

(30) Foreign Application Priority Data

Feb. 17, 1999    (JP)    ............................... 11-038909
Jan. 12, 2000    (JP)    ............................... 2000-4034

(51) Int. Cl.
*H01L 21/44*    (2006.01)
(52) U.S. Cl. ................ 438/617; 438/612; 257/E21.509
(58) Field of Classification Search ................ 438/616, 438/456, 457
See application file for complete search history.

(56) References Cited

U.S. PATENT DOCUMENTS 5,111,989 A    5/1992    Holdgrafer et al.
5,323,060 A    6/1994    Fogal et al.
5,422,435 A    6/1995    Takiar et al.
5,473,514 A    12/1995   Nagano
5,804,004 A    9/1998    Tuckerman et al.
5,842,628 A    12/1998   Nomoto et al.
6,100,594 A    8/2000    Fukui et al.
6,157,080 A    12/2000   Tamaki et al.

(Continued)

FOREIGN PATENT DOCUMENTS

EP    5 31724    3/1993

(Continued)

OTHER PUBLICATIONS

U.S. Appl. No. 10/162,864, filed Jun. 6, 2002 (now abandoned).

(Continued)

*Primary Examiner*—Michael Lebentritt
*Assistant Examiner*—Cheung Lee
(74) *Attorney, Agent, or Firm*—Nixon & Vanderhye P.C.

(57) ABSTRACT

In a manufacturing method of a semiconductor device, a substrate and a plurality of semiconductor chips stacked on the substrate are connected to each other by a ball bonding method adopting a reverse method. Specifically, after first bonding on a bonding pad on the substrate, a gold wire is led to a bonding pad of a semiconductor chip of the bottom layer, and by second bonding, a wire for connecting the substrate and the semiconductor chip of the bottom layer is formed. Similarly, other semiconductor chips are also connected to the substrate from the layer on the bottom. As a result, it is possible to reduce the package size, to provide a sufficient clearance between wires, and to reduce restrictions on combinations of semiconductor chips to be stacked.

21 Claims, 10 Drawing Sheets

U.S. PATENT DOCUMENTS

| | | | |
|---|---|---|---|
| 6,215,193 B1 | 4/2001 | Tao et al. | |
| 6,407,456 B1 | 6/2002 | Ball | |
| 7,176,558 B2 * | 2/2007 | Kang et al. | 257/676 |
| 2007/0065987 A1 * | 3/2007 | Mess et al. | 438/109 |

FOREIGN PATENT DOCUMENTS

| | | |
|---|---|---|
| JP | 57031166 A | 2/1982 |
| JP | 08-088316 | 4/1996 |
| JP | 10-116849 | 5/1998 |
| KR | 1996-0039238 | 11/1996 |
| KR | 1997-0053214 | 7/1997 |

OTHER PUBLICATIONS

U.S. Appl. No. 09/495,300, filed Feb. 1, 2000 (now abandoned).

Japanese Kokai (Published unexamined patent application) No. 116849/1998, published May 6, 1998, with Abstract and English translation.

"Chip Level Three-Dimensional Mounting Technique", Kada et al, *Semiconductor World,* Nov. 1999, pp. 58-61.

"Chip Level Three-Dimensional Mounting Technique", Fujita, *The Third Package & Mount Technology Symposium,* Nov. 12, 1999, pp. 47-59, 52, 55, 56.

U.S. Appl. No. 09/223,272, filed Dec. 30, 1998 and references cited therein.

U.S. Appl. No. 09/186,339, filed Nov. 5, 1998 and references cited therein.

Korean Office Action dated Jan. 25, 2002 and English Translation Thereof.

Stacked CSP (Chip Size Package) Technology No. 71 (published on Aug. 1998)(partial translation).

"Laminated Memory: A New 3-Dimensional Packaging Technology for MCMs,", Tuckerman et al., 1994 IEEE, pp. 58-63.

* cited by examiner

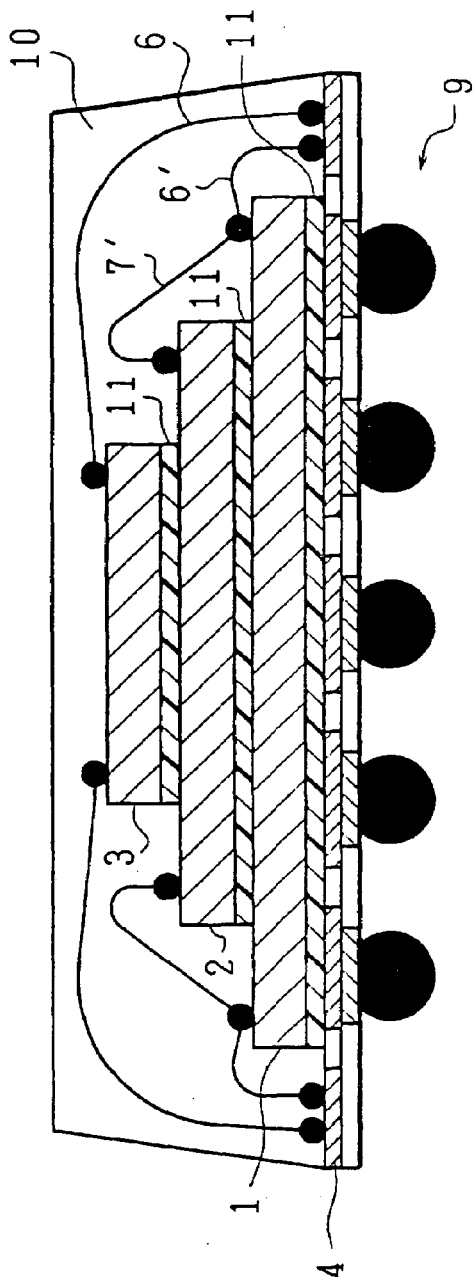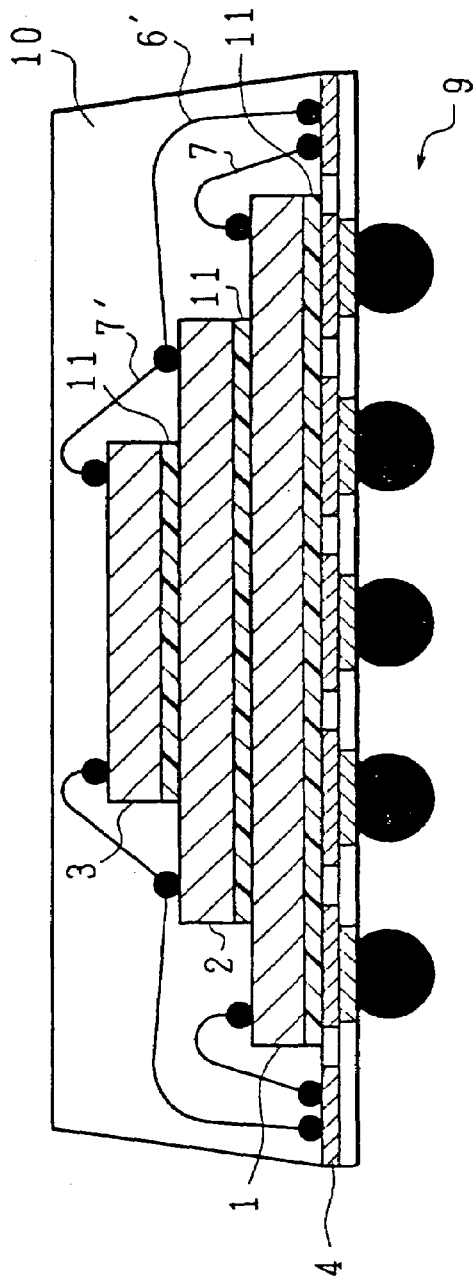
FIG. 7 (a)
FIG. 7 (b)

FIG. 9 (a) (Prior Art)
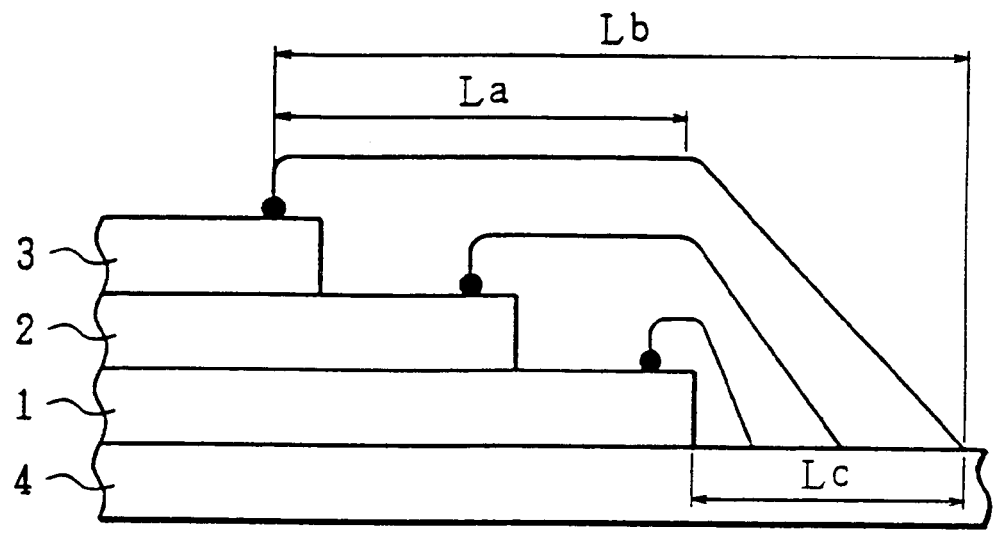
FIG. 9 (b) (Prior Art)
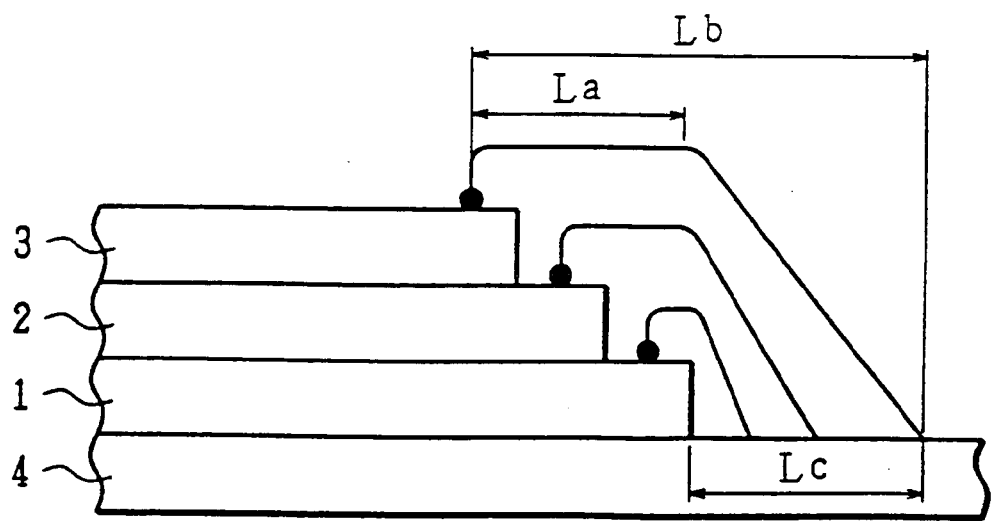

FIG. 10 (a) (Prior Art)
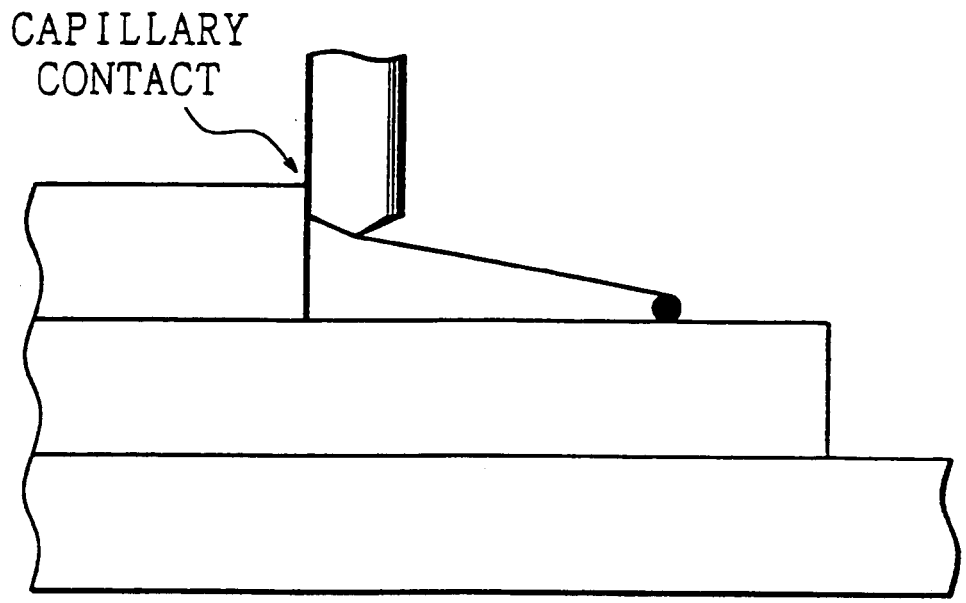
CAPILLARY CONTACT
FIG. 10 (b) (Prior Art)
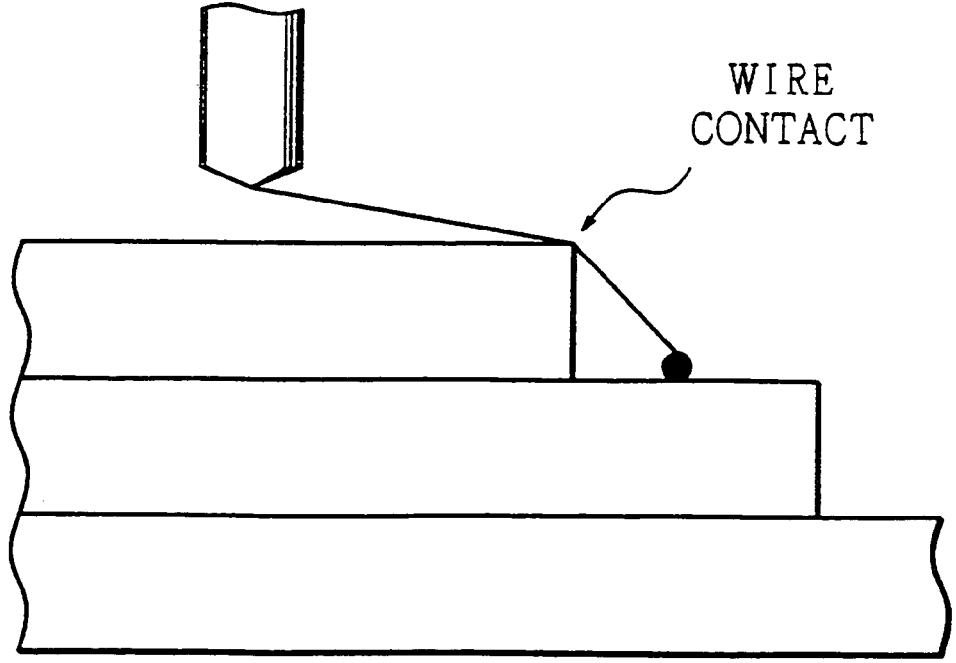
WIRE CONTACT

SEMICONDUCTOR DEVICE AND MANUFACTURING METHOD THEREOF

This application is a Divisional of application Ser. No. 10/162,864, filed Jun. 6, 2002 (abandoned), which is a Divisional of Ser. No. 09/495,300, filed Feb. 1, 2000 (abandoned), the entire contents of which are incorporated herein by reference in this application.

FIELD OF THE INVENTION

The present invention relates to a semiconductor device to be used in a stacked package in which a plurality of semiconductor chips are stacked, and to a manufacturing method thereof.

BACKGROUND OF THE INVENTION

A stacked package, in which a plurality of semiconductor chips are stacked, is one solution for the demand of smaller, lighter, and higher functioning electric devices including portable devices.

In assembling the stacked package, as the wire bonding method for making an electrical connection between the semiconductor chips and the substrate, a ball bonding (nailhead bonding) method using a gold wire, or a wedge bonding method using an aluminium wire is adopted.

In the wedge bonding method, in order to form a loop in a radial pattern, it is required to rotate a bonding head or a substrate because of directivity in wire directions. Also, in the wedge bonding method, when the semiconductor chip of the upper layer is small, it is required to position a bonding pad on the substrate away from an end of the semiconductor chip of the bottom layer because it is difficult to flex the wire. As a result, the package size is increased. Note that, the wedge bonding method commonly adopts the forward method in which the wire is first bonded on a bonding pad on the semiconductor chip and then second bonded on the bonding pad on the substrate.

Thus, to reduce the package size, the reverse method has been used, in which the order of connecting the wire is reversed, i.e., the first bonding is carried out on the bonding pad on the substrate and then the second bonding on the bonding pad of the semiconductor chip of the upper layer of stacked layers (Japanese Unexamined Patent Publication No. 116849/1998 (Tokukaihei 10-116849) (published date May 6, 1998)). The reverse method allows the wire to be shaped into the form of a "shoulder", by which the bonding pad on the substrate can be positioned closer to the end of the semiconductor chip of the bottom layer, thus reducing the package size.

However, while the reverse method of the wedge bonding method is effective when the semiconductor chips of the upper and lower layers have substantially the same size, when the semiconductor chip of the upper layer is smaller than the semiconductor chip of the lower layer, the wire length is increased. Further, because the aluminium wire used in wedge bonding is crushed to make the connection, if the wire is jiggled up and down after first bonding to change the shape of the wire loop, the connection becomes weak. Thus, in the reverse method of the wedge bonding method, it is difficult to bend the wire at an angle near the right angle, and the wire takes a circular shape with a round shoulder, thus making it difficult to reduce the size of the device.

On the other hand, in the ball bonding method, there is no directivity in wire directions, and thus it is not required to rotate the substrate, etc. and the loop can be made quickly, and therefore this method is suitable for mass production. Further, because the wire directions can be freely set, it offers a large degree of freedom in positioning of the bonding pad on the substrate. Moreover, second bonding can be made on the same bonding pad.

Namely, as shown in FIG. 9(a), with the ball bonding method, the wire can be flexed easily, and the bonding pad on the substrate can be positioned closer to the end of the semiconductor chip of the bottom layer, and thus the ball bonding method is suitable for miniaturization of the device.

Here, the ball bonding method for bonding the semiconductor chip with the substrate commonly adopts the forward method in which the wire is first bonded on the bonding pad on the semiconductor chip and then second bonded on the bonding pad on the substrate.

However, as shown in FIG. 9(a), in the bonding adopting the forward method, the flat length La is usually only about half the wire length Lb. Thus, when the forward method is used for the bonding of semiconductor chips 2 and 3 on the upper side of the semiconductor chip 1 with the substrate 4 to maintain a clearance from the wire of the lower layer, it is required to provide a sufficient distance from the second bonding position of the lower layer. As a result, the distance Lc from the end of the semiconductor chip 1 of the bottom layer to the bonding pad on the substrate 4 is increased, which in turn increases the package size.

For this problem, as shown in FIG. 9(b), by bringing the ends of the semiconductor chips 2 and 3 closer to the end of the semiconductor chip 1 of the lower layer, the flat length La can be reduced, which in turn reduces the wire length Lb and the distance Lc, thus reducing the package size. However, on the opposite side of the substrate 4, the bonding pad is moved away and the distance Lc is increased in return on the opposite side. Also, when the semiconductor chips 2 and 3 of the upper layers are increased in size to reduce the distance Lc, the yield of the chips is reduced, making the method unsuitable.

Further, in first bonding, in order to flex the wire in the form of a shoulder, it is required to move a capillary in a direction away from the bonding pad on the substrate. In this instance, there is a possibility that the capillary comes into contact with the end of the semiconductor chip of the upper layer (FIG. 10(a)), or the wire contacts the end of the semiconductor chip of the upper layer (FIG. 10(b)), and thus it is required to provide a sufficient distance between the bonding pad of the semiconductor chip of the lower layer and the end of the semiconductor chip of the upper layer.

As described, the conventional wire bonding method adopting the forward method has the problem that many restrictions are imposed on combinations of semiconductor chips to be stacked in wire bonding of the multi-layered semiconductor device.

SUMMARY OF THE INVENTION

An object of the present invention is to provide a semiconductor device which is capable of reducing a package size and providing a sufficient clearance between wires and reducing restrictions on combinations of semiconductor chips to be stacked, and to provide a manufacturing method of such a semiconductor device.

In order to achieve the foregoing object, a manufacturing method of a semiconductor device in accordance with the present invention for manufacturing a semiconductor device in which semiconductor chips are stacked on the substrate includes in a step of connecting the substrate and the semiconductor chips by wire bonding by a ball bonding method the step of: first bonding a wire on a bonding pad on a lower layer of two different layers of multiple layers composed of the substrate and the semiconductor chips and thereafter second bonding the wire on a bonding pad on an upper layer of the two different layers so as to connect the two different layers to each other.

Further, in order to achieve the foregoing object, a semiconductor device in accordance with the present invention in which a substrate and semiconductor chips stacked on the substrate are connected to one another by wire bonding by a ball bonding method has an arrangement in which two different layers of multiple-layers composed of the substrate and the semiconductor chips are connected to each other by first bonding a wire on a bonding pad on a lower layer of the two different layers and thereafter by second bonding the wire on a bonding pad on an upper layer of the two different layers.

With the above method and arrangement, the wire bonding of the two different layers of the multiple layers composed of the substrate and the semiconductor chips are carried out by the reverse method by which the wire is provided from the bonding pad on the bottom layer to the bonding pad on the upper layer. Thus, compared with the forward method in which the wire is provided in the reversed direction (order) from the reverse method, bonding can be made stably by suppressing the wire height even when the wire length is long. Further, because the wire rises straight up almost perpendicular to the first bonding portion, a clearance between wires can easily be provided. Also, even though the capillary needs to be moved in a direction away from the semiconductor chip in first bonding to flex the wire in the form of a shoulder, because there is no semiconductor chip (upper layer) is provided in this direction, the bonding pads on the substrate (lower layer) can be disposed close to one another.

Further, in second bonding on the semiconductor chip, the capillary moves perpendicularly without flowing in a direction toward the semiconductor chip of the adjacent upper layer, and thus the clearance between the bonding pad of the semiconductor chip to be subjected to second bonding and the edge of the semiconductor chip of the adjacent upper layer can be reduced, thus reducing restrictions on combinations of semiconductor chips to be stacked.

Thus, by using the reverse method in the ball bonding method to connect the stacked semiconductor chips and the substrate, it is possible to reduce the package size and to provide a sufficient clearance between wires and also to reduce restrictions on combinations of semiconductor chips to be stacked.

For a fuller understanding of the nature and advantages of the invention, reference should be made to the ensuing detailed description taken in conjunction with the accompanying drawings.

BRIEF DESCRIPTION OF THE DRAWINGS

FIG. 7(a) is an explanatory drawing showing the semiconductor device of FIG. 4(a) in an arrangement of a chip size package.

FIG. 7(b) is an explanatory drawing showing the semiconductor device of FIG. 4(b) in an arrangement of a chip size package.

FIG. 9(a) is an explanatory drawing schematically showing an arrangement of a conventional semiconductor device.

FIG. 9(b) is an explanatory drawing schematically showing an arrangement of the conventional semiconductor device.

FIG. 10(a) is an explanatory drawing showing a restriction imposed on a manufacturing step of the conventional semiconductor device, showing how a capillary contacts an end of a semiconductor chip of an upper layer.

FIG. 10(b) is an explanatory drawing showing a restriction imposed on a manufacturing step of the conventional semiconductor device, showing how a wire contacts an end of a semiconductor chip of an upper layer.

DESCRIPTION OF THE EMBODIMENTS

The following will describe one embodiment of the present invention referring to FIG. 1 through FIG. 8.

Figure 1:
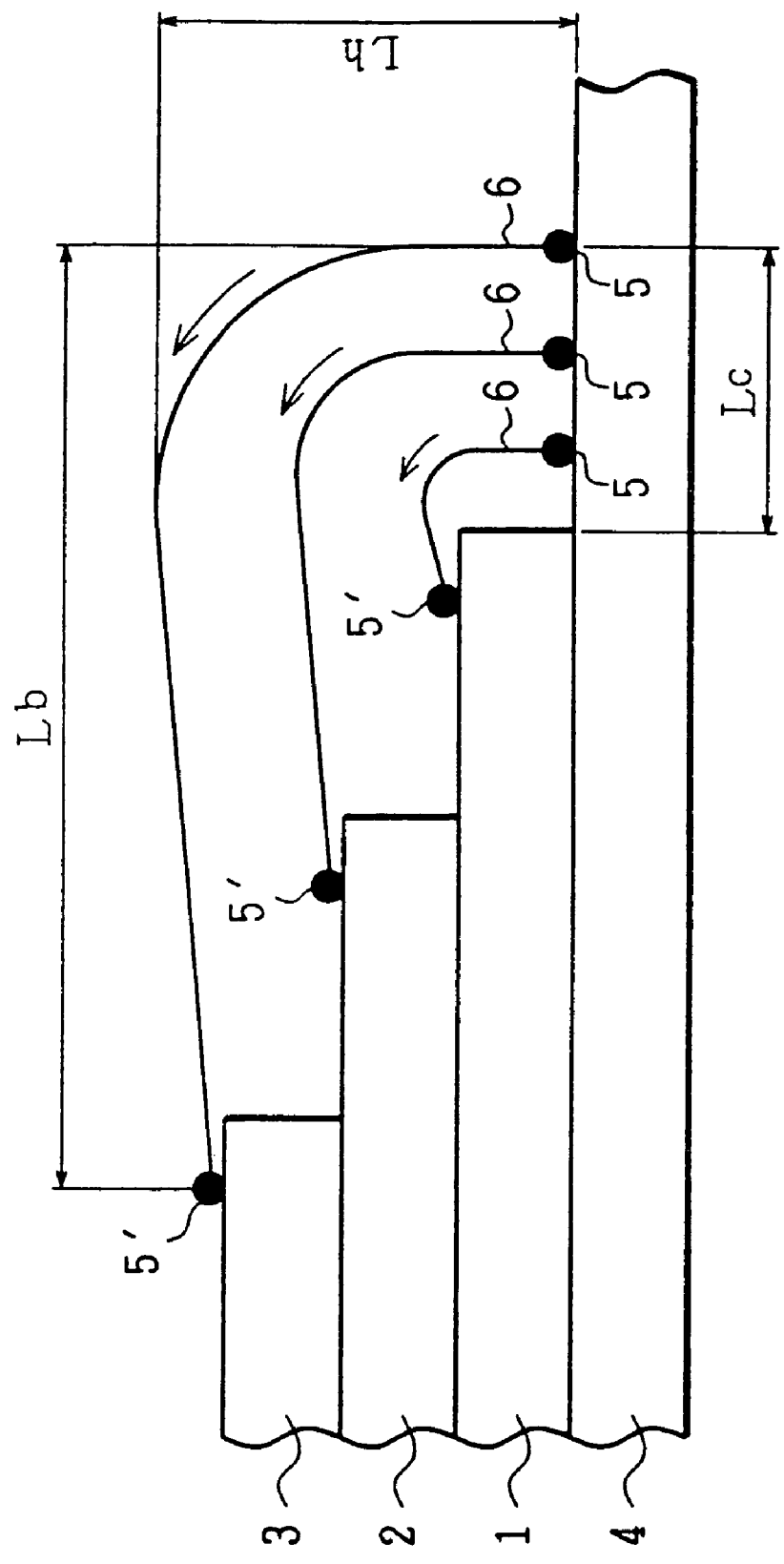
FIG. 1 is an explanatory drawing schematically showing an arrangement of a semiconductor device in accordance with one embodiment of the present invention.

As shown in FIG. 1, a semiconductor device in accordance with the present embodiment is a multi-layered semiconductor device having a three-layered structure in which a semiconductor chip 1 as a first layer, semiconductor chip 2 as a second layer, and semiconductor chip 3 as a third layer are stacked on a substrate 4 in this order, and the bonding pads of the semiconductor layers and the substrate are connected to each other by a ball bonding method.

Specifically, the connection is made by melting the tip of gold wire 6 which has been led through a capillary (bonding capillary) to form a ball, and by press-bonding the ball with heat on each bonding pad of the semiconductor chips 1 to 3 and the substrate 4. Note that, the wire bonding is made from the bottom layer. Also, the wire is not limited to the gold wire and other wires such as a copper wire may also be used.

In FIG. 1, the connection between the semiconductor chips 1, 2, and 3 and the substrate 4 is made by the reverse method. That is, the gold wire is first led through a capillary and the tip of the wire is melted to form a gold ball, and the gold ball thus formed is press bonded on the bonding pad of the semiconductor chip 1, and then the wire is cut at the peak of the gold ball to form a gold bump 5'. Secondly, a gold ball which was formed by melting a wire in the same manner is press bonded on the bonding pad of the substrate 4 so as to carry out first bonding. Thirdly, the gold wire is guided to the bonding pad of the semiconductor chip 1 to be bonded on the gold bump 5' on the bonding pad (second bonding), thus forming wire 6 connecting the semiconductor chip 1 and the substrate 4. Then, following the same steps, wire 6 for connecting the semiconductor chip 2 and the substrate 4 is formed, and finally, also by the same steps, wire 6 for connecting the semiconductor chip 3 and the substrate 4 is formed.

The reverse method offers more stable bonding compared with the forward method by suppressing wire height Lh even when wire length Lb becomes long, and in the reverse method, the wire 6 rises straight up almost perpendicular to the first bonding portion, and thus the clearance between wires 6 can be provided more easily. Also, even though it is required in first bonding that the capillary be moved in the opposite direction from the semiconductor chips 1, 2, and 3 in order to flex the wire 6 in the form of a shoulder, because there is no semiconductor chip is provided in this direction, the bonding pads on the substrate 4 can be disposed close to one another.

Further, in second bonding on the semiconductor chips 1 and 2, the capillary is not flown in a direction toward the adjacent upper semiconductor chips 2 and 3 but is moved perpendicular to the substrate 4. Thus, the clearance between the bonding pads of the semiconductor chips 1 and 2 and the edges of the adjacent upper semiconductor chips 2 and 3, respectively, can be reduced, thus reducing restrictions on combinations of semiconductor chips to be stacked.

In FIG. 1, in second bonding on the bonding pads of the semiconductor chips 1, 2, and 3, the gold bump 5' is formed by a ball portion of the gold wire used in the ball bonding method. The gold bump 5' may or may not be crushed. Also, the bump may or may not be formed on the bonding pads of the semiconductor chips 1, 2, and 3.

Here, in the first bonding, because the gold ball 5 is formed by melting the tip of the wire being held in position by the capillary (jig), the pressure exerted by the capillary for press bonding the gold ball 5 is absorbed by the gold ball 5 and no pressure is applied on the bonding pad, and thus the bonding pads of the semiconductor chips 1, 2, and 3 are undamaged. In contrast, in the second bonding, because no ball portion such as the gold ball 5 is formed on the tip of the wire, the pressure of the capillary is applied to the bonding pad, and the bonding pads of the semiconductor chips 1, 2, and 3 are damaged. For this problem, the gold bump 5' made from a ball portion of the gold wire is formed beforehand on the bonding pads of the semiconductor chips 1, 2, and 3, thus relieving the damage on the bonding pads of the semiconductor chips 1, 2, and 3 in the second bonding. Note that, the substrate 4 is not provided with semiconductor elements and there is no need to provide gold bump 5' on the substrate 4.

Figure 2:
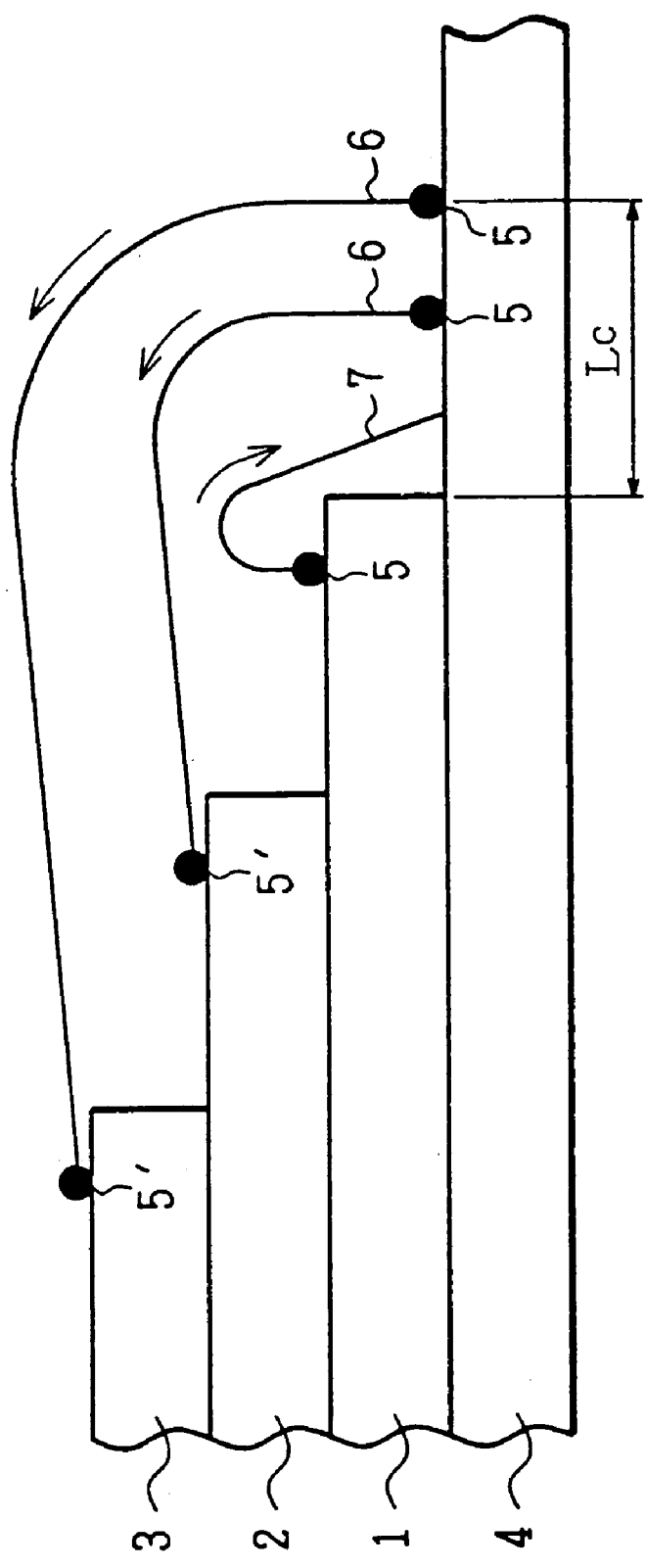
FIG. 2 is an explanatory drawing schematically showing another arrangement of the semiconductor device in accordance with one embodiment of the present invention.

Alternatively, as shown in FIG. 2, in the semiconductor device in accordance with the present embodiment, the semiconductor chip 1 as the first layer and the substrate 4 may be bonded with each other by the forward method, and the other semiconductor chips 2 and 3 as the second and third layers, respectively, may be bonded with the substrate 4 by the reverse method.

Namely, first, after first bonding the gold ball 5 on the bonding pad of the semiconductor chip 1, the gold wire is led to the bonding pad of the substrate 4 for second bonding, thus forming wire 7 connecting the semiconductor chip 1 and the substrate 4. Secondly, gold bump 5' is formed on the bonding pad of the semiconductor chip 2 as the second layer. Thirdly, after first bonding the gold ball 5 on the bonding pad of the substrate 4, the gold wire is led to the bonding pad of the semiconductor chip 2, and by carrying out second bonding on the gold bump 5', the wire 6 connecting the semiconductor chip 2 and the substrate 4 is formed. Subsequently, by following the steps used for the second layer, wire 6 connecting the semiconductor chip 3 as the third layer and the substrate 4 is formed.

Alternatively, gold bump 5' may be formed first on each bonding pad of the semiconductor chips 2 and 3, followed by formation of wire 7, and the wire 6 for connecting the semiconductor chip 2 and the substrate 4, and the wire 6 for connecting the semiconductor chip 3 and the substrate 4 may be formed successively. Namely, wire bonding may be carried out successively by forming the gold bump 5' beforehand on a plurality of bonding pads to be subjected to second bonding. However, this method is not totally desirable because it is required to position the wire 6 and the gold bump 5' again in second bonding, and thus the former method in which the gold bump 5' is formed per wire 6 has the advantage.

Figure 3:
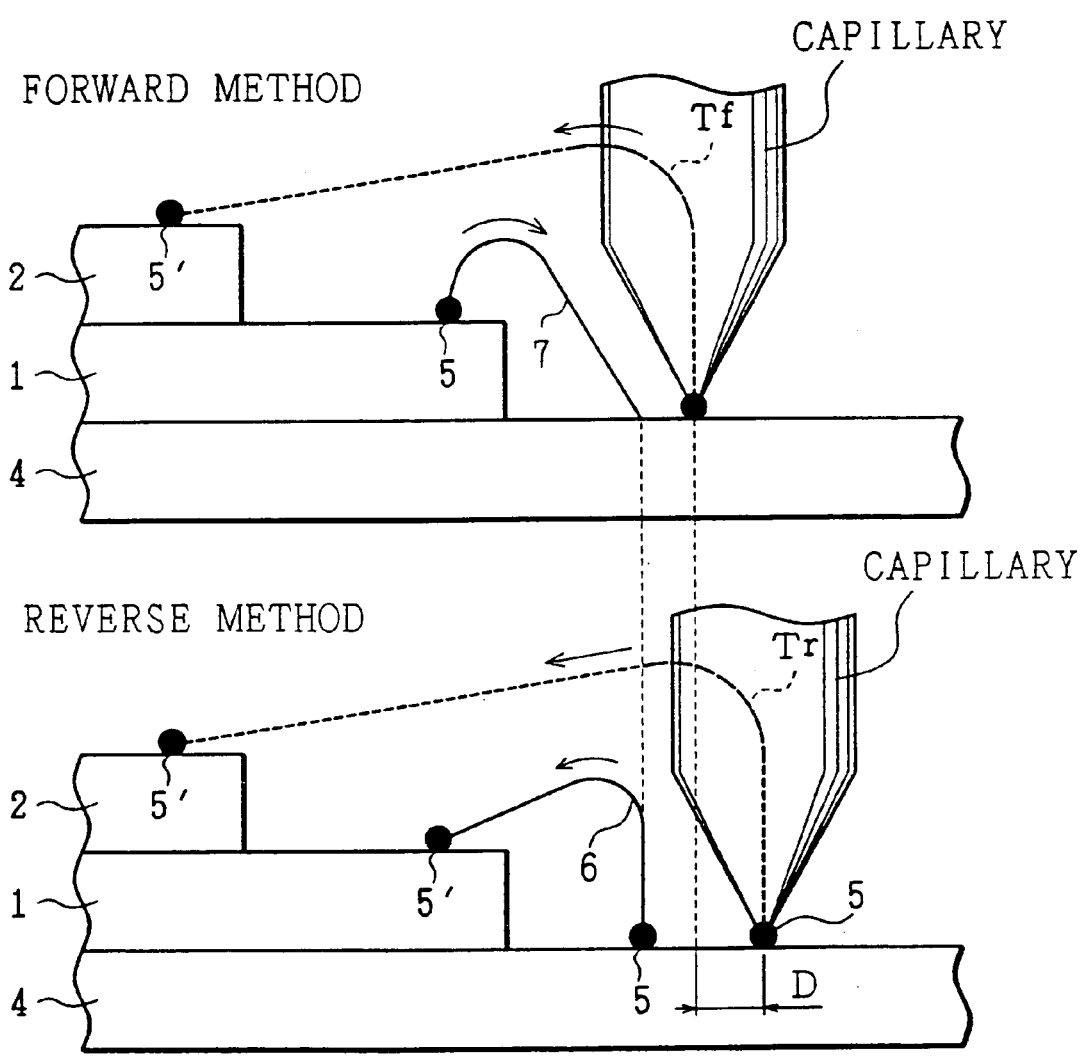
FIG. 3 is an explanatory drawing of the semiconductor device of FIG. 2.

In this manner, by making the connection of the semiconductor chip 1 as the first layer using wire 7 by the forward method and by making each connection of the semiconductor chips 2 and 3 as the upper layers (second layer and above) using wire 6 by the reverse method, the clearance between the wire 7 of the first layer and the wire 6 of the second layer can easily be provided, thus realizing a smaller package size than the arrangement as shown in FIG. 1 (all connections are made by the reverse method) Specifically, as shown in FIG. 3, comparing the wires connecting the substrate 4 and the semiconductor chip 1 between the reverse method and the forward method, while the wire 6 which was formed by the reverse method rises straight up almost perpendicular to the substrate 4, the wire which was formed by the forward method rises from the substrate 4 by being inclined toward the semiconductor chip 1. Further, when forming the wire for connecting the substrate 4 and the semiconductor chip 2, the capillary for leading the wire needs to be moved without touching the wire 6 or 7 connecting the substrate 4 and the semiconductor chip 1. Thus, when the substrate 4 and the semiconductor chip 1 is connected by wire 7 (forward method), the tip of the capillary leading the wire for connecting the substrate 4 and the semiconductor chip 2 follows the trajectory Tf. On the other hand, when the substrate 4 and the semiconductor chip 1 is connected by wire 6 (reverse method), the tip of the capillary leading the wire for connecting the substrate 4 and the semiconductor chip 2 follows the trajectory Tr. Thus, by forming the wire using the reverse method above the wire which was formed by the forward method, the capillary for leading the upper wire (reverse method) can be moved toward the semiconductor chip by the amount of incline of the lower wire (forward method). Further, the position of the bonding pad on the substrate 4 can be moved by the distance D toward the semiconductor chips 1 and 2.

Further, unlike the method for making all connections by the reverse method using wire 6 (FIG. 1), it is not required to form a gold bump for second bonding of the wire 7 of the first layer onto the substrate 4, thus reducing manufacturing time and the amount of gold wire consumed.

Thus, when there is enough clearance between the bonding pad of the semiconductor chip 1 as the first layer and the edge of the semiconductor chip 2 as the second layer by the combination of semiconductor chips stacked, it is preferable that the connection of the semiconductor chip 1 as the first layer is made by the forward method using wire 7, and each connection of the semiconductor chips 2 and 3 as the upper layers (second layer and above) is made by the reverse method using wire 6.

Further, in the case where semiconductor chips having the same terminal position are to be stacked, for example, as with flash memory chips having different capacities, the semiconductor chips and the substrate are stacked by aligning the bonding pads and are connected to each other using the common bonding pads of the semiconductor chip in the middle.

Figure 6:
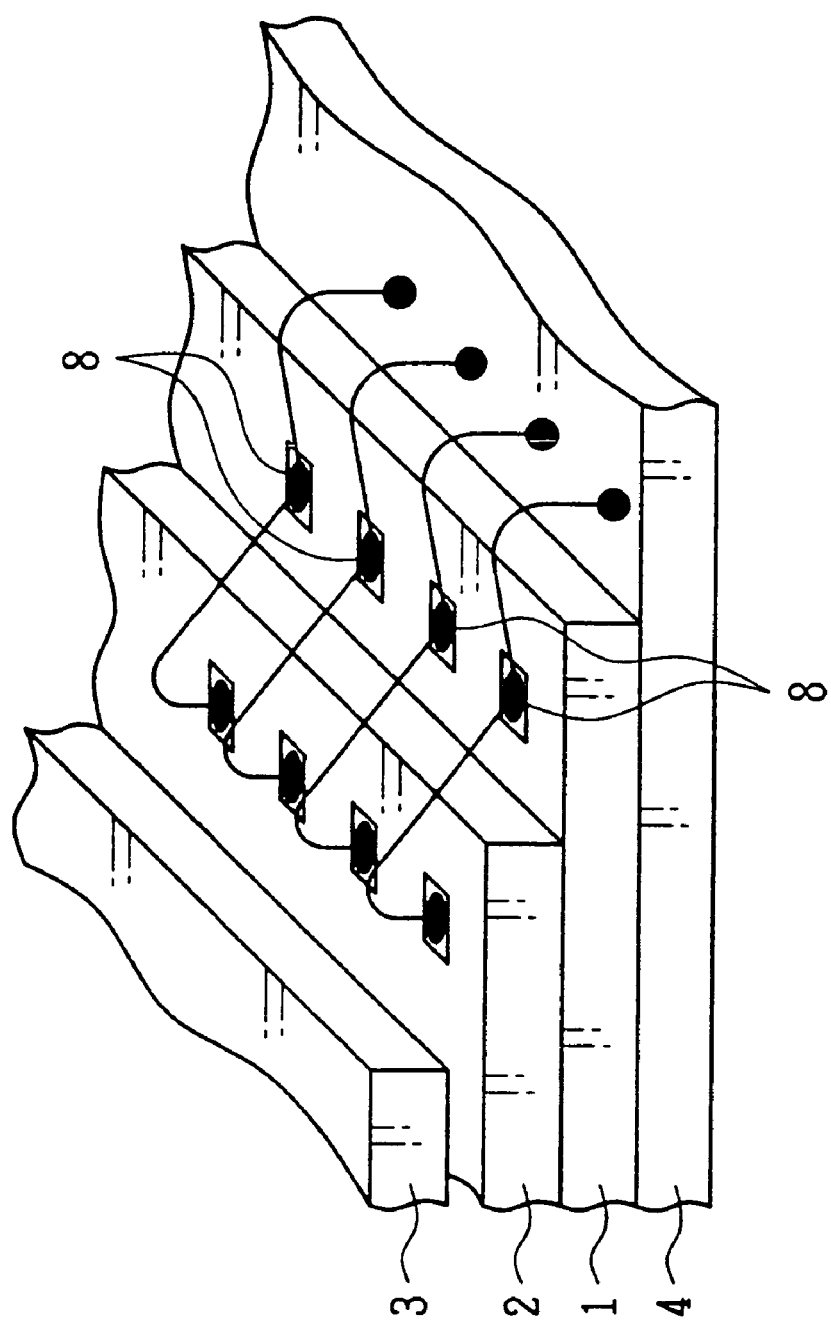
FIG. 6 is an explanatory drawing of the semiconductor device as shown in FIGS. 4(a) and 4(b) and FIGS. 5(a), 5(b), and 5(c).

Specifically, as shown in FIG. 6, the semiconductor chips 1 and 2 as the first and second layers, respectively, and the substrate 4 are stacked by aligning the bonding pads, and using bonding pads (bonding pads on the middle layer) 8 of the semiconductor chip 1 as common bonding pads, the wire bonding between the semiconductor chips 1 and 2 and the wire bonding between the semiconductor chip 1 and the substrate 4 are made.

Figure 4:
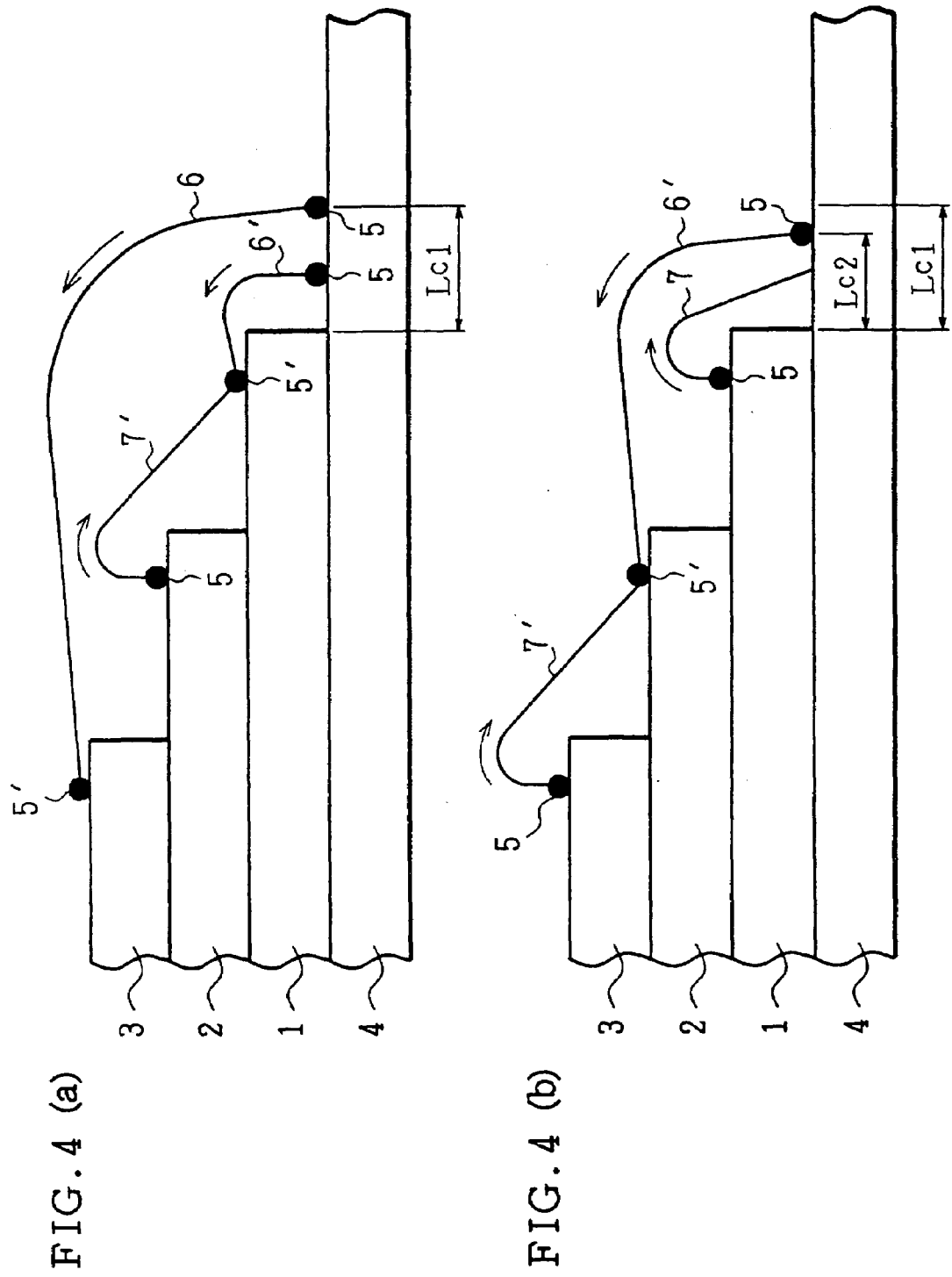
FIG. 4(a) is an explanatory drawing schematically showing an yet another arrangement of the semiconductor device in accordance with one embodiment of the present invention.
FIG. 4(b) is an explanatory drawing schematically showing a still another arrangement of the semiconductor device in accordance with one embodiment of the present invention.

In this case, as shown in FIG. 4(*a*), the substrate 4 and the semiconductor chip 1 are connected to each other by the reverse method, and the semiconductor chips 1 and 2 are connected to each other by the forward method. Thereafter, the semiconductor chip 3 as the third layer and the substrate 4 are connected to each other by the reverse method.

More specifically, first, gold bump 5' is formed on the bonding pad of the semiconductor chip 1 as the first layer. Secondly, after first bonding on the bonding pad of the substrate 4 by the gold ball 5, the gold wire is led to the gold bump 5' on the bonding pad of the semiconductor chip 1, and by second bonding on the gold bump 5', wire 6' connecting the substrate 4 and the semiconductor chip 1 is formed. Thirdly, after first bonding on the bonding pad of the semiconductor chip 2 as the second layer by the gold ball 5, the gold wire is led to the gold bump 5' on the bonding pad of the semiconductor chip 1, and by second bonding on the gold bump 5', wire 7' connecting the semiconductor chips 1 and 2 are formed. Finally, the gold bump 5' is formed on the bonding pad of the semiconductor chip 3 as the third layer, and after first bonding on the bonding pad of the substrate 4 by the gold ball 5, the gold wire is led to the gold bump 5' on the bonding pad of the semiconductor chip 3, and by second bonding, wire 6 connecting the semiconductor chip 3 and the substrate 4 is formed. Note that, the wire 6' and wire 7' may be formed in the reversed order.

In this manner, by stacking the layers by aligning the bonding pads, and by connecting the semiconductor chips 1 and 2 and the substrate 4 to each other using the bonding pads of the semiconductor chip 1 as the common bonding pads, the number of bonding pads on the substrate 4 can be reduced from three to two, thus reducing the package size. Further, because the wire 7' connecting the semiconductor chips 1 and 2 is shorter than the wire which directly connects the semiconductor chip 2 and the substrate 4, manufacturing time can be reduced, as well as the amount of gold wire consumed, and further, this method is effective in preventing deformation of wire (wire flow), which is incurred by resin when sealing is made.

As shown in FIG. 4(*b*), when the semiconductor chips 2 and 3 as the second and third layers, respectively, have the same terminal position, the semiconductor chip 1 and the substrate 4 are connected to each other by the forward method, and the semiconductor chip 2 and the substrate 4 are connected to each other by the reverse method, and the semiconductor chips 3 and 2 are connected to each other by the forward method.

More specifically, first, after first bonding on the bonding pad of the semiconductor chip 1 as the first layer by the gold ball, the gold wire is led to the bonding pad of the substrate 4, and by second bonding, wire 7 connecting the semiconductor chip 1 and the substrate 4 is formed. Secondly, gold bump 5' is formed on the bonding pad of the semiconductor chip 2 as the second layer. Thirdly, after first bonding on the bonding pad of the substrate 4 by the gold ball 5, the gold wire is led to the gold bump 5' on the bonding pad of the semiconductor chip 2, and by second bonding on the gold bump 5', wire 6' connecting the substrate 4 and the semiconductor chip 2 is formed. Finally, after first bonding on the bonding pad of the semiconductor chip 3 as the third layer by the gold ball 5, the gold wire is led to the gold bump 5' on the bonding pad of the semiconductor chip 2, and by second bonding on the gold bump 5', wire 7' connecting the semiconductor chips 3 and 2 is formed. Note that, the wire 6' and wire 7' may be formed in the reversed order.

In this manner, by stacking the layers by aligning the bonding pads, and by connecting the semiconductor chips 2 and 3 and the substrate 4 to each other using the bonding pads of the semiconductor chip 2 as the common bonding pads, the number of bonding pads on the substrate 4 can be reduced from three to two, thus reducing the package size. Further, because the wire 7' connecting the semiconductor chips 2 and 3 is shorter than the wire which directly connects the semiconductor chip 3 and the substrate 4, manufacturing time can be reduced, as well as the amount of gold wire consumed, and further, this method is effective in preventing deformation of wire (wire flow), which is incurred by resin when sealing is made.

In this case, because the semiconductor chip 1 and the substrate 4 are connected to each other by the forward method, compared with the arrangement in which the connection is made by the reverse method as shown in FIG. 4(*a*), the distance Lc2 from the end of the semiconductor chip 1 of the bottom layer to the bonding pad on the substrate 4 can be made shorter than distance Lc1, thus further reducing the package size.

Figure 5:
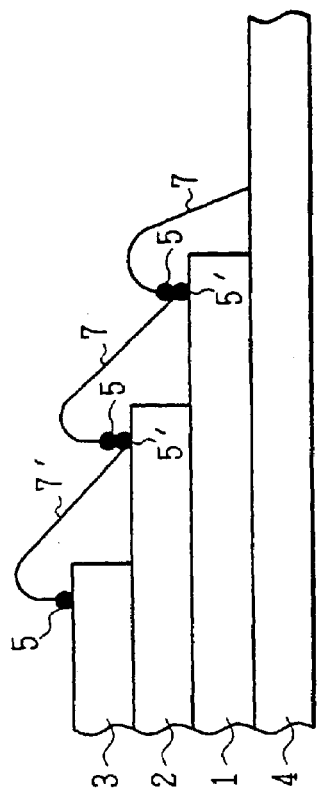
FIG. 5(a) is an explanatory drawing schematically showing an yet another arrangement of the semiconductor device in accordance with one embodiment of the present invention.
FIG. 5(b) is an explanatory drawing showing a still another arrangement of the semiconductor device in accordance with one embodiment of the present invention.
FIG. 5(c) is an explanatory drawing showing an yet another arrangement of the semiconductor device in accordance with one embodiment of the present invention.
Figure 5:
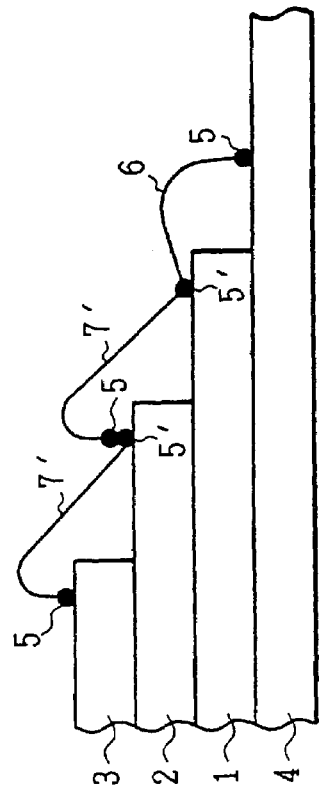
Figure 5:
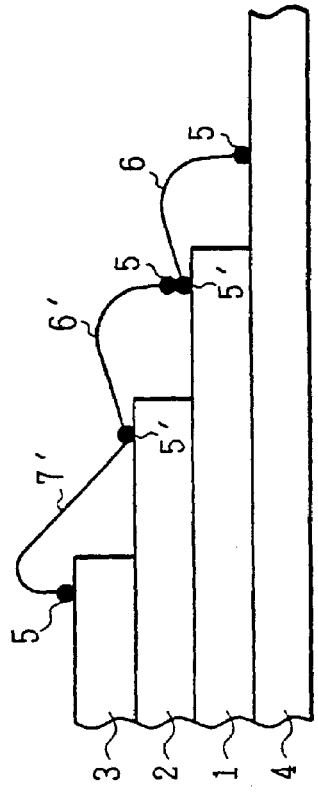

As shown in FIG. 5(*a*) through FIG. 5(*c*), when the semiconductor chips 1, 2, and 3 all adopt a flash chip memory or SRAM (Static Random Access Memory), etc., the wire connections can be made between semiconductor chips 3 and 2, between semiconductor chips 2 and 1, and between semiconductor chip 1 and the substrate 4.

In FIG. 5(*a*), first, gold bump 5' is formed on the bonding pad of the semiconductor chip 2. Secondly, after first bonding on the bonding pad of the semiconductor chip 3 by the gold ball 5, the gold wire is led to the gold bump 5' on the bonding pad of the semiconductor chip 2, and by second bonding on the gold bump 5', wire 7' connecting the semiconductor chips 3 and 2 is formed. Thirdly, the gold bump 5' is formed on the bonding pad of the semiconductor chip 1. Fourthly, after first bonding on the gold bump 5' on the bonding pad of the semiconductor chip 2 by the gold ball 5, the gold wire is led to the gold bump 5' on the bonding pad of the semiconductor chip 1, and by second bonding on the gold bump 5', wire 7' connecting the semiconductor chips 2 and 1 is formed. Fifth, after first bonding on the gold bump 5' formed on the bonding pad of the semiconductor chip 1 by the gold ball 5, the gold wire is led to the bonding pad of the substrate 4, and by second bonding, wire 7 connecting the semiconductor chip 1 and the substrate 4 is formed.

In this manner, by making connections using the bonding pads of the semiconductor chips 1 and 2 as the common bonding pads, only a single bonding pad is required on the substrate 4, thus further reducing the package size. Further, because the wires 7 and 7' connecting the semiconductor chips 1 and 2 to each other and the semiconductor chips 2 and 3 to each other, respectively, is shorter than the wires which directly connect the semiconductor chip 2 and the substrate 4 to each other and the semiconductor chip 3 and the substrate 4 to each other, respectively, manufacturing time can be reduced, as well as the amount of gold wire consumed, and further, this method is effective in preventing deformation of wire (wire flow), which is incurred by resin when sealing is made. Moreover, because it is not required to form the wire on top of the other, there is no possibility of wire contact between upper and lower wires.

However, when forming the wire 7' connecting the semiconductor chips 2 and 1, the capillary is moved in a direction away from the bonding pad of the semiconductor chip 1, and thus the capillary or wire may come into contact with the wire 7' connecting the semiconductor chips 3 and 2. The same might occur when forming the wire 7' connecting the semiconductor chip 1 and the substrate 4. In order to avoid this kind of contact, it is required to provide a sufficient distance between the bonding pad of the semiconductor chip 3 and the bonding pad of the semiconductor chip 2 and also the distance between the bonding pad of the semiconductor chip 2 and the bonding pad of the semiconductor chip 1 so that the wire 7' rises gradually from the bonding pad of the semiconductor chip 2 and the semiconductor chip 1, and as a result more restrictions are imposed on combinations of semiconductor chips to be stacked.

In FIG. 5(*b*), first, gold bump 5' is formed on the bonding pad of the semiconductor chip 2. Secondly, after first bonding on the bonding pad of the semiconductor chip 3 by the gold ball 5, the gold wire is led to the gold bump 5' on the bonding pad of the semiconductor chip 2, and by second bonding on the gold bump 5', wire 7' connecting the semiconductor chips 3 and 2 is formed. Thirdly, the gold bump 5' is formed on the bonding pad of the semiconductor chip 1. Fourthly, after first bonding on the bonding pad of the substrate 4 by the gold ball 5, the gold wire is led to the gold bump 5' on the bonding pad of the semiconductor chip 1, and by second bonding on the gold bump 5', wire 6 connecting the substrate 4 and the semiconductor chip 1 is formed. Fifth, after first bonding by the gold ball 5 on the gold bump 5' formed on the bonding pad of the semiconductor chip 2, the gold wire is led to the gold bump 5' on the bonding pad of the semiconductor chip 1, and by second bonding on the gold bump 5', wire 7' connecting the semiconductor chips 2 and 1 is formed. Note that, the wire 7' connecting the semiconductor chips 2 and 1 and the wire 6 connecting the semiconductor chip 1 and the substrate 4 may be formed in the reversed order.

In this manner, by making connections using the bonding pads of the semiconductor chips 1 and 2 as the common bonding pads, only a single bonding pad is required on the substrate 4, thus further reducing the package size. Further, because the wire 7' connecting the semiconductor chips 1 and 2 to each other and the semiconductor chips 2 and 3 to each other is shorter than the wire which directly connects the semiconductor chips 2 and the substrate 4 to each other and the semiconductor chip 3 and the substrate 4 to each other, manufacturing time can be reduced, as well as the amount of gold wire consumed, and further, this method is effective in preventing deformation of wire (wire flow), which is incurred by resin when sealing is made. Moreover, because it is not required to form the wire on top of the other, there is no possibility of wire contact between upper and lower wires.

However, when forming the wire 7' connecting the semiconductor chips 2 and 1, the capillary is moved in a direction away from the bonding pad of the semiconductor chip 1, and thus the capillary or wire may come into contact with the wire. 7' connecting the semiconductor chips 3 and 2. In order to avoid this contact, it is required to provide a sufficient distance between the bonding pad of the semiconductor chip 3 and the bonding pad of the semiconductor chip 2 so that the wire 7' rises gradually from the bonding pad of the semiconductor chip 2, and as a result more restrictions are imposed on combinations of semiconductor chips to be stacked.

In FIG. 5(*c*), first, gold bump 5' is formed on the bonding pad of the semiconductor chip 2. Secondly, after first bonding on the bonding pad of the semiconductor chip 3 by the gold ball 5, the gold wire is led to the gold bump 5' on the bonding pad of the semiconductor chip 2, and by second bonding on the gold bump 5', wire 7' connecting the semiconductor chips 3 and 2 is formed. Thirdly, the gold bump 5' is formed on the bonding pad of the semiconductor chip 1. Fourthly, after first bonding on the bonding pad of the substrate 4 by the gold ball 5, the gold wire is led to the gold bump 5' on the bonding pad of the semiconductor chip 1, and after second bonding on the gold bump 5', wire 6 connecting the semiconductor chip 1 and the substrate 4 is formed. Fifth, after first bonding by the gold ball 5 on the gold bump 5' formed on the bonding pad of the semiconductor chip 1, the gold wire is led to the gold bump 5' on the bonding pad of the semiconductor chip 2, and by second bonding on the gold bump 5', wire 6' connecting the semiconductor chips 2 and 1 is formed.

In this manner, by making connections using the bonding pads of the semiconductor chips 1 and 2 as the common bonding pads, only a single bonding pad is required on the substrate 4, thus further reducing the package size. Further, because the wire 6' and wire 7' connecting the semiconductor chips 1 and 2 to each other and the semiconductor chips 2 and 3 to each other, respectively, is shorter than the wires which directly connect the semiconductor chips 2 and the substrate 4 to each other and the semiconductor chip 3 and the substrate 4 to each other, respectively, manufacturing time can be reduced, as well as the amount of gold wire consumed, and further, this method is effective in preventing deformation of wire (wire flow), which is incurred by resin when sealing is made. Moreover, because it is not required to form the wire on top of the other, there is no possibility of wire contact between upper and lower wires.

In this case, when forming the wire 6' connecting the semiconductor chips 2 and 1, even though the capillary is moved in a direction away from the bonding pad of the semiconductor chip 2, because the wire 6 rises gradually from the bonding pad of the semiconductor chip 1, the possibility of capillary or wire coming into contact with wire 6 connecting the semiconductor chip 1 and the substrate 4 is small. Thus, compared with FIG. 5(*a*) and FIG. 5(*b*), less restrictions are imposed on combinations of semiconductor chips to be stacked.

As described, the arrangement in which connections are made using the bonding pads of the middle layer as the common bonding pads is further effective when applied to the connection between semiconductor chips having the same terminal position. For example, when applied to flash memory chips (multi-layered semiconductor device in which semiconductor chips 1 and 2 are flash memory and semiconductor chip 3 is SRAM) having the same terminal position but different capacities, the semiconductor chips of the first and second layers may be wire bonded in the manner as shown in FIG. 6.

As shown in FIGS. 7(a) and 7(b), the semiconductor device in accordance with the present embodiment (FIG. 1, FIG. 2, FIGS. 4(a) and 4(b), FIGS. 5(a), 5(b), and 5(c)) may be packaged by forming a ball grid array 9 which is a disposed array of solder balls under the substrate 4, and by molding with sealing resin 10. Note that, FIGS. 7(a) and 7(b) adopt the semiconductor devices as shown in FIGS. 4(a) and 4(b), respectively.

Thus, the arrangements of the semiconductor device as described above become further effective particularly in the semiconductor device which is reduced to a substantial chip size, such as a CSP (Chip Size Package).

Figure 8:
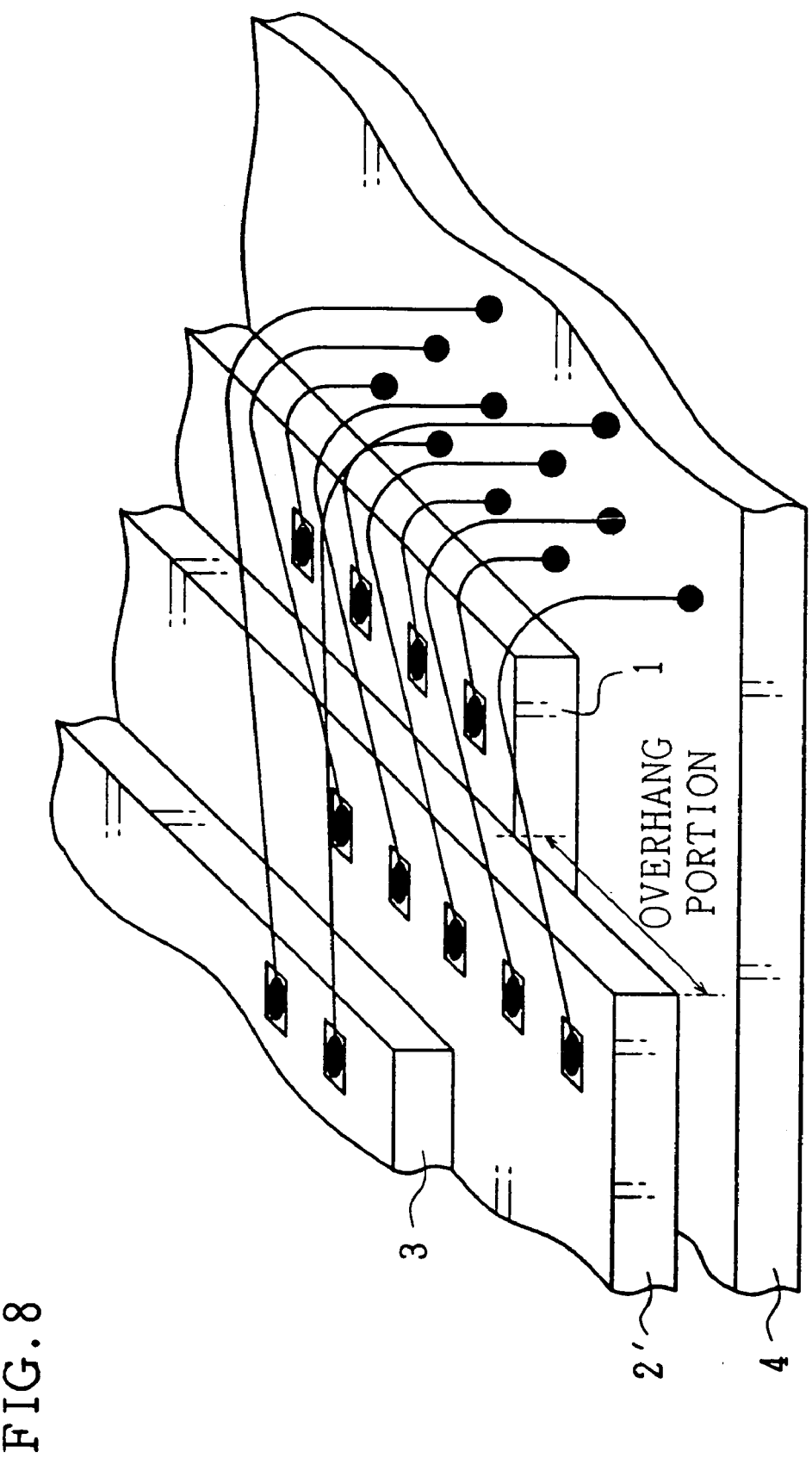
FIG. 8 is an explanatory drawing of the semiconductor device of FIG. 1.

Depending on the combination of the semiconductor chips stacked, there exists, for example, a long semiconductor chip, and when it is placed on the bottom layer, there is a case where the bonding pads of such a semiconductor chip are hidden under the semiconductor chip of the upper layer. In such a case, the semiconductor device would have an arrangement as shown in FIG. 8 in which a semiconductor chip 2' as the second layer protrudes (overhang portion) from the semiconductor chip 1 as the first layer.

The bonding method of the semiconductor device in accordance with the present embodiment is also applicable to the bonding of the bonding pads on the overhang portion, and thus it can adapt to the combination of semiconductor chips which includes the overhang portion.

As described, with the semiconductor device and the manufacturing method thereof in accordance with the present embodiment, the package size can be reduced, and it is also possible to provide a sufficient clearance between wires, and restrictions on combinations of semiconductor chips to be stacked can be reduced.

Note that, the described embodiment is not to limit the scope of the present invention in any ways, and various modifications of such is possible within the scope of the present invention. In particular, even though the foregoing embodiment is based on the semiconductor device in which semiconductor chips are stacked on the substrate in three layers, the present invention is also applicable to the semiconductor device in which the semiconductor chips are stacked in larger numbers.

The manufacturing method of a semiconductor device in accordance with the present invention may include in a step of connecting the substrate and the semiconductor chips by wire bonding the step of first bonding a wire on a bonding pad on a lower layer of two different layers of multiple layers composed of the substrate and the semiconductor chips and thereafter second bonding the wire on a bonding pad on an upper layer of the two different layers so as to connect the two different layers to each other.

With this method, the wire bonding of two different layers of multiple layers composed of the substrate and the semiconductor chips can be carried out by the reverse method above the wire which was formed by the forward method from the bonding pad on the upper layer to the bonding pad on the lower layer.

Thus, a clearance can be provided easily between the lower wire formed by the forward method and the upper wire formed by the reverse method. Namely, while the wire which was formed by the reverse method takes the form rising straight up almost perpendicularly from the lower layer, the wire which was prepared by the forward method takes the form inclining toward the semiconductor chip from the lower layer. Thus, by forming the wire by the reverse method above the wire which was formed by the forward method, the capillary for leading the upper wire (reverse method) can be moved more toward the semiconductor chip by the amount of incline of the lower wire (forward method). In other words, the first bonding position on the substrate can be shifted toward the semiconductor chip, thereby reducing the package size (by the distance D in FIG. 3).

Also, in the forward method, it is not required to form a bump on the substrate, thus reducing manufacturing time and the amount of wire material consumed.

Further, in the manufacturing method of the semiconductor device, all of the above wire bonding can be carried out using the substrate as the lower layer.

With this method, by using the ball bonding method and the reverse method to connect the substrate and all semiconductor chips, it is possible to reduce the package size and to provide a sufficient clearance between wires and also to reduce restrictions on combinations of semiconductor chips to be stacked. This method is particularly suitable when the substrate as the lower layer has the bonding pads in the same number as that of the bonding pads of the stacked semiconductor chips.

Further, the manufacturing method of the semiconductor device in accordance with the present invention for manufacturing a semiconductor device in which a plurality of semiconductor chips are stacked on the substrate may include in a step of connecting the substrate as the lower layer and the semiconductor chip as the upper layer the steps of first bonding a wire on a bonding pad of the substrate and thereafter second bonding the wire on a bonding pad on a semiconductor chip adjacently on the substrate so as to connect the substrate and the semiconductor chip to each other; and first bonding a wire on a bonding pad on the substrate and thereafter second bonding the wire on a bonding pad on other semiconductor chips so as to connect the substrate and the other semiconductor chips to each other.

With this method, the wire for connecting the substrate and the semiconductor chip adjacently on the substrate can be formed by the forward method, and the wire for connecting the substrate and the other semiconductor chips can be formed by the reverse method. Thus, the capillary for leading the upper wire (reverse method) can be moved more toward the semiconductor chip by the amount of incline of the lower wire (forward method). Namely, the first bonding position on the substrate can be shifted toward the semiconductor chip, thus reducing the package size (by the distance D in FIG. 3). Also, in the forward method, it is not required to form a bump, thus reducing manufacturing time and the amount of wire material consumed.

Further, the manufacturing method of the semiconductor device may include a step of forming a bump on the bonding pad of the semiconductor chip when second bonding the wire on the bonding pad of the semiconductor chip.

With this method, when carrying out second bonding on the bonding pad on the semiconductor chip of the upper layer, by forming a bump using a wire material used for the ball bonding method, the damage caused by the second bonding on the bonding pad of the semiconductor chip can be reduced.

Further, the manufacturing method of the semiconductor device may include in a step of connecting to one another three different layers of the multiple-layers composed of the substrate and the semiconductor chips by wire bonding using a bonding pad of a middle layer as a common bonding pad the steps of: first bonding a wire on a bonding pad on a bottom layer of the three different layers and thereafter second bonding the wire on the bonding pad on the middle layer so as to connect the bottom layer and the middle layer to each other; and first bonding a wire on a bonding pad on a top layer of the three different layers and thereafter second bonding the wire on the bonding pad on the middle layer so as to connect the top layer and the middle layer to each other.

With this method, by connecting three different layers of multiple-layers composed of the semiconductor chips and the substrate using the bonding pad of the middle layer as the common bonding pad, the number of bonding pads on the substrate can be reduced from three to two, thus reducing the package size. Also, because the wire connecting the upper layer and the middle layer is shorter than the wire which directly connects the bottom layer and the top layer, it is possible to reduce manufacturing time and the amount of wire material consumed, and further this method is effective in preventing a wire flow in resin sealing.

Further, the semiconductor device in accordance with the present invention may be arranged such that the lower layer is the substrate.

With this arrangement, by using the ball bonding method and the reverse method to connect the substrate and all semiconductor chips, it is possible to reduce the package size and to provide a sufficient clearance between wires, and also to reduce restrictions on combinations of semiconductor chips to be stacked. This method is particularly suitable when the substrate as the lower layer has the bonding pads in the same numbers as that of the bonding pads of the stacked semiconductor chips.

Further, the semiconductor device in accordance with the present invention, in which a plurality of semiconductor chips are stacked on the substrate, may have an arrangement in which the substrate and a semiconductor chip adjacently on the substrate are connected to each other by first bonding a wire on a bonding pad on the substrate and thereafter by second bonding the wire on a bonding pad on the semiconductor chip, and the substrate and other semiconductor chips are connected to each other by first bonding a wire on a bonding chip on the substrate and thereafter second bonding the wire on a bonding pad of the other semiconductor chips.

With this arrangement, the wire for connecting the substrate and the semiconductor chip adjacently on the substrate can be formed by the forward method, and the wire for connecting the substrate and the other semiconductor chips can be formed by the reverse method. Thus, the capillary for leading the upper wire (reverse method) can be moved more toward the semiconductor chip by the amount of incline of the lower wire (forward method). Namely, the first bonding position on the substrate can be shifted toward the semiconductor chip, thus reducing the package size (by the distance D in FIG. 3). Further, in the forward method, it is not required to form a bump, thus reducing manufacturing time and the amount of wire material consumed.

Further, the semiconductor device may have an arrangement in which layers of the substrate and the semiconductor chips are stacked so that the positions of their bonding pads are aligned between adjacent upper and lower layers.

With this arrangement, the bonding pads of the substrate and semiconductor chips are aligned between adjacent upper and lower layers, thus connecting three or more of different layers to one another using the bonding pad of the middle layer. As a result, the number of bonding pads on the substrate can be reduced, which in turn reduces the package size. Also, because the wire which connects, for example, the top layer and the middle layer of the three different layers is shorter than the wire which directly connects the bottom layer and the top layer to each other, it is possible to reduce manufacturing time and the amount of wire material consumed, and further this method is effective in preventing a wire flow in resin sealing.

Further, the semiconductor device may be arranged to have a chip size package structure.

With this arrangement, the effect of reducing the semiconductor device to substantially the size of the semiconductor chips can be obtained.

The wire bonding method of the semiconductor device in accordance with the present invention, when wire bonding two or more layers of stacked semiconductor chips (multi-layered semiconductor chips) and the substrate by the ball bonding method, may adopt the reverse method as the method of wire bonding the semiconductor chips and the substrate, i.e., the wire may be first bonded on the bonding pad on the substrate and then second bonded on the bonding pad on the semiconductor chip.

Further, in the wire bonding method of the semiconductor device, when wire bonding the stacked three layers of semiconductor chips and the substrate, the semiconductor chip of the first layer and the substrate may be connected to each other by the forward method, and the semiconductor chips of the second and third layers and the substrate may be connected to each other by the reverse method.

The wire bonding method of the semiconductor device may form a gold bump on the bonding pad of the semiconductor chip, to which the reverse method was applied, so as to carry out second bonding.

The wire bonding method of the semiconductor device may form a gold bump on the bonding pad of the semiconductor chip so as to carry out second bonding by the reverse method on the gold bump and second bonding by the forward method on the gold bump.

The wire bonding method of the semiconductor device for manufacturing a semiconductor device in which the semiconductor chips are stacked on the substrate may connect, in the step of wire bonding the substrate and the semiconductor chips to each other, the substrate and the plural layers of semiconductor chips by first bonding all wires on the substrate of the bottom layer and thereafter by second bonding the wires on the bonding pads of the semiconductor chips.

The wire bonding method of the semiconductor device for manufacturing a semiconductor device in which the semiconductor chips are stacked on the substrate may connect, in the step of wire bonding the substrate and the semiconductor chips to each other, the substrate and the plural layers of semiconductor chips by carrying out first bonding on the semiconductor chip adjacently on the substrate and thereafter by second bonding on the substrate so as to connect the substrate of the bottom layer and the semiconductor chip adjacently on the substrate, and by carrying out first bonding on the substrate and thereafter by second bonding on the other semiconductor chips so as to connect the substrate and the other semiconductor chips.

Further, the semiconductor device in accordance with the present invention may be arranged such that when wire bonding the multi-layered semiconductor chips and the substrate by the ball bonding method, all the semiconductor chips and the substrate are bonded with each other by the reverse method.

The semiconductor device may be arranged such that when wire bonding three layers of the semiconductor chips and the substrate by the ball bonding method, the semiconductor chip of the first layer and the substrate are bonded by the forward method, and the semiconductor chips of the second and third layers and the substrate are bonded by the reverse method.

The semiconductor device may be arranged such that when wire bonding three layers of the semiconductor chips and the substrate by the ball bonding method, the semiconductor chip of the second layer and the semiconductor chip of the first layer are bonded by the forward method, and the substrate and the semiconductor chip of the first layer are bonded by the reverse method, and the substrate and the semiconductor chip of the third layer are bonded by the reverse method.

The semiconductor device may be arranged such that when wire bonding three layers of the semiconductor chips and the substrate by the ball bonding method, the semiconductor chip of the first layer and the substrate are bonded by the forward method, and the substrate and the semiconductor chip of the second layer are bonded by the reverse method, and the semiconductor chip of the third layer and the semiconductor chip of the second layer are bonded by the forward method.

The semiconductor device may have an arrangement of a chip size package (CSP) structure.

The semiconductor device may be arranged such that the semiconductor chip of the upper layer protrudes (overhang portion) from the semiconductor chip of the lower layer.

The semiconductor device may have an arrangement including a group of semiconductor chips which are stacked in such a manner that semiconductor chips having the same terminal position are adjacent to each other between upper and lower layers when stacking the multi-layered semiconductor chips.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device in which semiconductor chips including a first layer, a second layer and a third layer are stacked in this order on a substrate, the method comprising:
    first bonding a wire on a first bonding pad on the substrate and a bonding pad on the first layer,
    second bonding a wire on the bonding pad on the first layer and a bonding pad on the second layer, and
    third bonding a wire on a second bonding pad on the substrate and a bonding pad on the third layer.

2. The method of claim 1, wherein:
    in the first bonding, the wire is bonded on the first bonding pad on the substrate and thereafter the wire is bonded on the bonding pad of the first layer,
    in the second bonding, the wire is bonded on the bonding pad on the second layer and thereafter the wire is bonded on the bonding pad of the first layer, and
    in the third bonding, the wire is bonded on the second bonding pad on the substrate and thereafter the wire is bonded on the bonding pad of the third layer.

3. The method of claim 1, wherein:
    the substrate and the first layer are adjacent one another;
    the first layer and the second layer are adjacent one another; and
    the second layer and the third layer are adjacent one another.

4. The method of claim 2, wherein:
    the substrate and the first layer are adjacent one another;
    the first layer and the second layer are adjacent one another; and
    the second layer and the third layer are adjacent one another.

5. A method of manufacturing a semiconductor device in which semiconductor chips including a first layer, a second layer and a third layer are stacked in this order on a substrate, the method comprising:
    first bonding a wire on a first bonding pad on the substrate and a bonding pad on the first layer,
    second bonding a wire on a second bonding pad on the substrate and a bonding pad on the second layer, and
    third bonding a wire on the bonding pad on the second layer and a bonding pad on the third layer.

6. The method of claim 5, wherein:
    in the first bonding, the wire is bonded on the first bonding pad on the substrate and thereafter the wire is bonded on the bonding pad of the first layer,
    in the second bonding, the wire is bonded on the second bonding pad on the substrate and thereafter the wire is bonded on the bonding pad of the second layer, and
    in the third bonding, the wire is bonded on the bonding pad on the third layer and thereafter the wire is bonded on the bonding pad of the second layer.

7. The method of claim 6, wherein:
    the substrate and the first layer are adjacent one another;
    the first layer and the second layer are adjacent one another; and
    the second layer and the third layer are adjacent one another.

8. The method of claim 5, wherein:
    the substrate and the first layer are adjacent one another;
    the first layer and the second layer are adjacent one another; and
    the second layer and the third layer are adjacent one another.

9. A method of manufacturing a semiconductor device in which plural semiconductor chips are stacked on a substrate, said method comprising connecting to one another given layers included in multiple layers composed of the substrate and the plural semiconductor chips by wire bonding at least partially by a ball bonding method the steps of:
    first bonding a first wire on a bonding pad on a lower layer of two layers except a semiconductor chip of an uppermost layer of the multiple layers and thereafter second bonding the first wire on a bonding pad on an upper layer of the two layers; and
    first bonding a second wire on a bonding pad on the lower layer and thereafter second bonding the second wire on a bonding pad on a layer sandwiched between at least the lower layer and the upper layer.

10. The method as set forth in claim 9, further comprising the step of:
    first bonding a third wire on a bonding pad on the lower layer and thereafter second bonding the third wire on a bonding pad on a layer stacked above the upper layer.

11. The method as set forth in claim 9, further comprising the step of:
    first bonding a third wire on the bonding pad on the lower layer and thereafter second bonding the third wire on a bonding pad on the uppermost layer.

12. The method as set forth in claim 9, wherein at least one certain semiconductor chip of the plural semiconductor chips has a protruding portion protruding from a semiconductor chip located below the certain semiconductor chip.

13. The method as set forth in claim 12, wherein the certain semiconductor chip has a bonding pad at the protruding portion.

14. The method as set forth in claim 9, further comprising the step of forming a bump on a bonding pad on at least one of the semiconductor chips.

15. The method as set forth in claim 9, wherein the lower layer is the substrate.

16. The method of claim 9, wherein the first wire and the second wire are both electrically connected to the same bonding pad on the lower layer.

17. The method of claim 9, wherein ball bonding is used to bond each of the first and second wires on the bonding pad(s) on the lower layer.

18. The method of claim 9, wherein ball bonding is used to bond the first wire to the bonding pad on the upper layer.

19. The method of claim 9, wherein ball bonding is used to bond the second wire to the bonding pad on the layer sandwiched between at least the lower layer and the upper layer.

20. The method of claim 9, wherein the second wire is bonded to the lower layer prior to the first wire being bonded to the lower layer.

21. A method of manufacturing a semiconductor device in which plural semiconductor chips are stacked on a substrate, said method comprising connecting to one another given layers included in multiple layers composed of the substrate and the plural semiconductor chips by wire bonding at least partially by a ball bonding method the steps of:

first bonding a wire on a bonding pad on a lower layer of two layers except a semiconductor chip of an uppermost layer of the multiple layers and thereafter second bonding the wire on a bonding pad on an upper layer of the two layers; and first bonding a wire on a bonding pad on a layer sandwiched between the lower layer and the upper layer and thereafter second bonding the wire on a bonding pad on the lower layer.

* * * * *